(12) United States Patent
Kiehl

(10) Patent No.: US 6,492,836 B2
(45) Date of Patent: Dec. 10, 2002

(54) RECEIVER IMMUNE TO SLOPE-REVERSAL NOISE

(75) Inventor: Oliver Kiehl, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/726,984

(22) Filed: Nov. 30, 2000

(65) Prior Publication Data

US 2002/0063586 A1 May 30, 2002

(51) Int. Cl.[7] .............................................. H03K 19/017
(52) U.S. Cl. .......................................... 326/83; 326/27
(58) Field of Search ............................. 326/21, 26, 27, 326/82, 83, 86, 87, 89–91

(56) References Cited

U.S. PATENT DOCUMENTS

| | | | |
|---|---|---|---|
| 4,431,930 A | | 2/1984 | Monticelli |
| 4,575,859 A | | 3/1986 | Ollendick |
| 4,612,466 A | * | 9/1986 | Stewart ........................ 326/83 |
| 4,745,365 A | | 5/1988 | Ugenti |
| 4,775,807 A | | 10/1988 | Bukowski, Jr. |
| 5,065,412 A | | 11/1991 | Schenk |
| 5,122,690 A | * | 6/1992 | Bianchi ........................ 326/87 |
| 5,327,072 A | | 7/1994 | Savignac et al. |
| 5,519,344 A | * | 5/1996 | Proebsting .................... 326/83 |
| 5,654,652 A | * | 8/1997 | Raza et al. .................... 326/87 |
| 5,796,281 A | | 8/1998 | Saeki et al. |
| 5,889,707 A | * | 3/1999 | Yang ............................. 326/83 |
| 6,094,086 A | * | 7/2000 | Chow ........................... 326/87 |

OTHER PUBLICATIONS

Figures from: Baker et al., *CMOS Circuit Design, Layout and Simulation*, IEEE Press, 1998.

* cited by examiner

Primary Examiner—Don Phu Le
(74) Attorney, Agent, or Firm—Stanton Braden

(57) ABSTRACT

A receiver circuit provides a first stage having an input for receiving input signals and an output node. The first stage includes an amplifier. A second stage has an input coupled to the output of the first stage. The second stage includes a switching circuit coupled to the output node of the first stage for driving the input signals by favoring a rising edge or a falling edge in accordance with a control signal. The second stage also includes a feedback loop coupled to an output of the second stage. The feedback loop provides the control signal for switching the switching circuit to favor the rising edge or falling edge.

31 Claims, 6 Drawing Sheets

RECEIVER IMMUNE TO SLOPE-REVERSAL NOISE

BACKGROUND

1. Technical Field

This disclosure relates to receiver circuits, and more particularly, to a receiver circuit immune to noise superimposed to a signal during or shortly after a transition.

2. Description of the Related Art

Digital circuits may be subject to noisy signals. Noisy signals may result in bit errors when converting the analog waveforms to digital signals. Noise suppression can reduce noise. For example, in receiver circuits that convert (noisy) analog input signals to digital on-chip signals, hysteresis is one means to suppress noise. Instances of slope reversal caused by reflections on ill terminated signal traces and extremely slow transitions (e.g., in burn-in test setups for semiconductor device tests) superimposed with random noise can cause incomplete pulses and spikes of the on-chip digital signals. This can cause malfunction of circuitry that assumes certain minimum and maximum pulse widths.

A structure of a differential amplifier-based receiver is shown in FIG. 1. A first stage 10 includes an N-channel differential pair 11 with a P-channel current mirror 13. A second stage 12 is realized by an inverter 14. One advantage of this configuration is that a switch-point is very well defined by the reference voltage VREF. The switch-point is the input voltage level (VIN) at which the output switches. For good system performance, a hysteresis of about 5–10% of the input voltage (VIN) swing is desirable. For stub series terminated logic (SSTL-2, for example), this would be a few tens of mV's.

The prior art realization of receivers with hysteresis does not typically provide sufficient hysteresis control. The prior art provides weak controllability (i.e., achieving a small shift of the switch point based on the output state) or slow reaction time (i.e., incapability to suppress fast noise spikes). Negative noise pulses typically occur shortly after a transition (change in state). Such noise (or slope reversal noise) is typical for ill matched or unterminated clock traces as a consequence of reflections.

In U.S. Pat. No. 5,796,281, adding additional current to an output node of a first stage (differential amplifier) creates hysteresis. Note however, that the amount of current added is not well controlled and thus the amount of hysteresis is not well controlled. To achieve small hysteresis the transistors (for example, Q2 in U.S. Pat. No. 5,796,281) that switch the additional current have to be a small fraction of the size of main transistors of the amplifiers in U.S. Pat. No. 5,796,281. For speed purposes, however, these transistors are close to their minimum size already. Thus, it is very difficult, if not impossible, to achieve small and controlled amounts of hysteresis. Note that a hysteresis, which is too large, will also adversely affect speed. FIGS. 26.4 and 26.5 of Baker et al., "CMOS Circuit Design, Layout and Simulation," IEEE press 1998, also show circuitry for providing additional current at an output node of a first stage to attempt to control hysteresis. This circuit suffers from the same drawbacks as described above.

In other attempts to introduce controlled small amounts of hysteresis, a reference voltage is shifted based on the output state of the receiver. Although some controllability is achieved, the switching process takes too long to effectively help suppress noise spikes. It also requires two reference voltage generators, which cause additional current consumption. See e.g., U.S. Pat. No. 4,775,807.

In U.S. Pat. No. 4,745,365, the solution described consumes even more power by utilizing two receivers with offset VREF. Both receivers have to run at the same speed.

Even with the limited control of hysteresis, the receiver systems of the prior art may also suffer from the drawback of oscillations in the case of extremely slow transitions or static input signals with a value between the switch points (state transition changes) of the receiver circuit. This makes these approaches unfeasible where there is no strict lower limit on the slew rate.

Therefore, a need exists for a receiver design which has the same power and receiving delay as the conventional (e.g., differential amplifier and inverter stage of FIG. 1) receiver, but also is highly immune to negative noise pulses occurring shortly after a transition.

SUMMARY OF THE INVENTION

A receiver circuit provides a first stage having an input for receiving input signals and an output node. The first stage includes an amplifier. A second stage has an input coupled to the output of the first stage. The second stage includes a switching circuit coupled to the output node of the first stage for driving the input signals by favoring a rising edge or a falling edge in accordance with a control signal. The second stage also includes a feedback loop coupled to an output of the second stage. The feedback loop provides the control signal for switching the switching circuit to favor the rising edge or falling edge.

Another receiver circuit includes a first circuit having two modes of operation controlled by a feedback loop. The feedback loop is connected to an output of the first circuit, and the modes of operation include a first mode having a quicker response to an input falling signal edge than a second mode and a second mode with a quicker response to an input rising signal edge than the first mode. A driver stage is integrated into the first circuit to favor the rising edge or the falling edge in accordance with a control signal provided by the feedback loop.

In other embodiments, the second stage may include an inverter coupled to the output of the first stage, and the inverter preferably has an output representing the output of the receiver circuit. The second stage may include a first transistor coupled between the output of the inverter and a supply voltage and a second transistor coupled between the output of the inverter and a ground, wherein the first and second transistors have different strengths relative to transistors of the inverter to provide skewed driver strength for driving the input signals to the output of the second stage.

In still other embodiments, the second stage may include current sources coupled to an input of the inverter and coupled to gates of the first and second transistors through the switching circuit to provide driving current to the inverter and the first and second transistors in accordance with the control signal. The switching circuit may include switching elements switched by the control signal to alternately select circuit elements, which favor a rising edge and a falling edge. The switching elements may include CMOS transfer gates. The amplifier may include a differential amplifier and/or a transconductance amplifier. The input signals may include analog signals and the receiver circuit preferably suppresses noise of the analog signals. The output preferably represents a digital logic state. The feedback loop may include delay elements such that noise after a transition in the input signals is suppressed for a delay period provided by the delay elements provided by the delay elements. The feedback loop may be programmable to adjust the delay period provided by the delay elements. The feedback loop may be controlled by a control circuit to adjust the delay period provided by the delay elements. The delay period may be controlled in accordance with an input signal input to the receiver circuit. A delay value of the delay elements is preferably less than half a clock period of the input signal.

Another receiver circuit, in accordance with the present invention, includes a first stage having an input for receiving input signals and an output node, the first stage including an amplifier, and a second stage having an input coupled to the output of the first stage. The second stage includes an inverter coupled to the output of the first stage, the inverter having an output representing the output of the receiver circuit and including transistors, a first transistor coupled between the output of the inverter and a supply voltage, and a second transistor coupled between the output of the inverter and a ground, wherein the first and second transistors have different strengths relative to the transistors of the inverter to favor a transition edge being driven to suppress noise after the transition edge. A feedback loop is coupled from the output of the inverter for enabling switching elements, the switching elements being switched in accordance with the output of the inverter to favor the transition edge being driven at the output of the inverter.

In other embodiments, the first transistor may include a P-channel transistor and the inverter may include an N-channel transistor and a relative strength ratio between the P-channel transistor and the N-channel transistor is preferably between about 3:1 to about 10:1. The second transistor may include an N-channel transistor and the inverter may include an P-channel transistor and a relative strength ratio between the N-channel transistor and the P-channel transistor is preferably between about 3:1 to about 10:1. Current sources may be coupled to an input of the inverter and coupled to gates of the first and second transistors through the switching elements to provide driving current to the inverter and the first and second transistors in accordance with a control signal on the feedback loop.

In still other embodiments, the switching elements may include CMOS transfer gates. The amplifier may include a differential amplifier and/or a transconductance amplifier. The input signals may include analog signals and the receiver circuit preferably suppresses noise of the analog signals. The inverter output preferably represents a digital logic state. The feedback loop may include delay elements such that noise after a transition in the input signals is suppressed for a delay period provided by the delay elements provided by the delay elements. A delay value of the delay elements is preferably less than half a clock period of the input signal.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to noise suppression in receiver circuits, and more particularly to skewed circuits which favor falling edges and rising edges at different times to eliminate the effects of noise after a transition. The present invention also is capable of adjusting hysteresis to compensate for the skewing. The present invention will be described in terms of an illustrative receiver circuit using field effect transistors; however, the present invention should not be construed as limited by the illustrative circuits. Instead, variations to the circuits described herein, as well as, other circuits and logic standards (e.g., SSTL, TTL, VVTTL, GTL, etc.) may enjoy the benefits of the present invention.

Slope-reversal noise of an input signal is suppressed, in accordance with the invention, by inhibiting the reverse slope for a short period after a (valid) transition. In a preferred embodiment, this is achieved by negative or reverse (dynamic) hysteresis compensation of a skewed driver circuit. Oscillations for slow input signals are prevented by (static) hysteresis by employing a feedback loop from the output of the circuit. The circuits of the present invention will be explained in greater detail below.

Figure 2A:
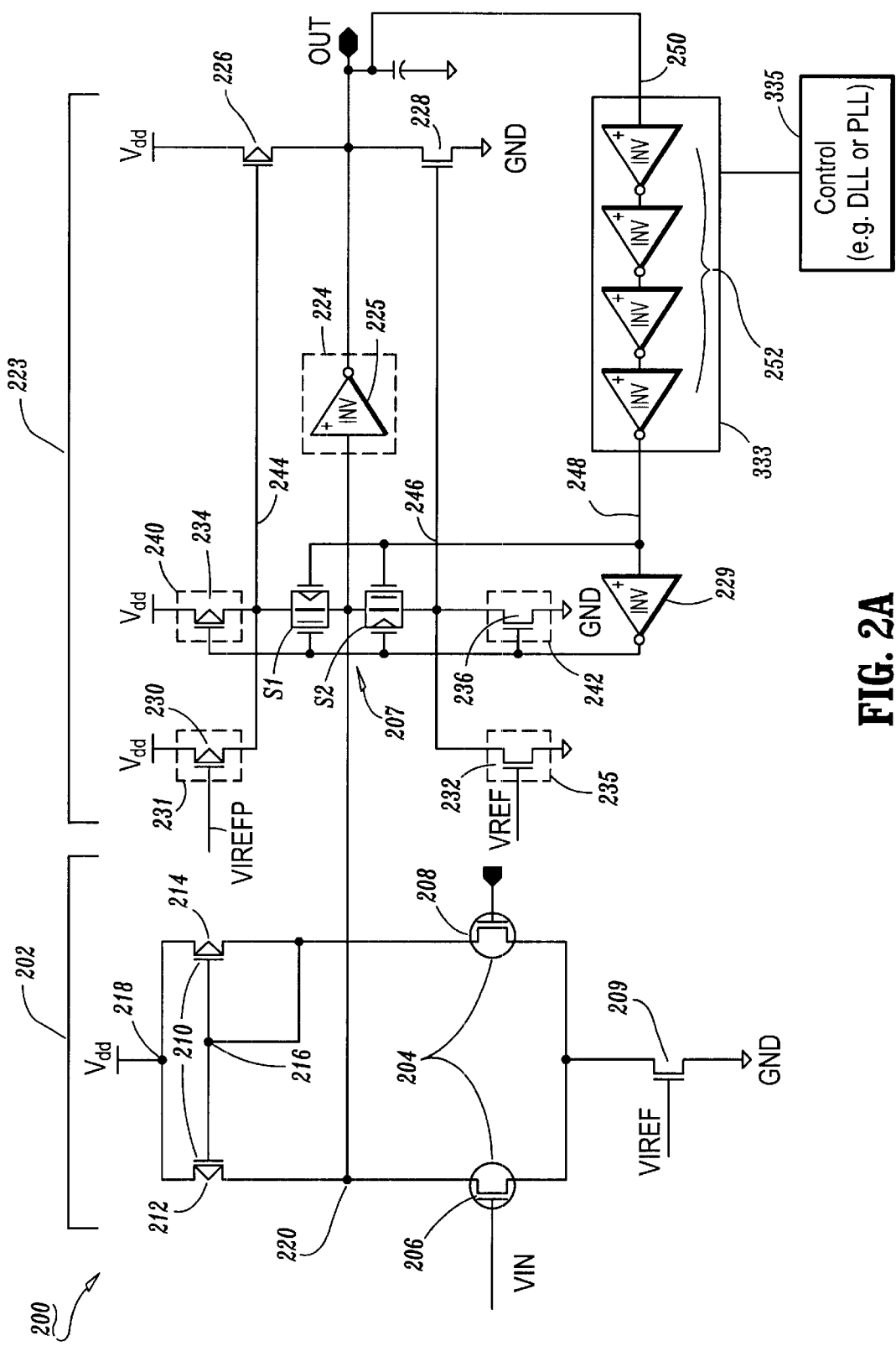
FIG. 2A is a schematic diagram showing a receiver circuit in accordance with one embodiment of the present invention.

Referring now in specific detail to the drawings in which like reference numerals identify similar or identical elements throughout the several views, and initially to FIG. 2A, an illustrative receiver circuit 200 is shown in accordance with one embodiment of the present invention. A receiver circuit 200 includes a first stage 202, which includes an amplifier, preferably, a differential amplifier employed for noise suppression, and more preferably, a transconductance differential amplifier. Other amplifiers may be employed for first stage as well, for example a folded cascode amplifier or any other amplifier which outputs current based on a difference of input voltage to a reference voltage (e.g., VREF). Circuit 200 includes an input (VIN) which preferably receives analog signals. In an illustrative embodiment, first stage 202 may include an N-channel differential pair 204. A first N-channel transistor 206 has a gate connected to VIN for receiving input signals. A second N-channel transistor 208 includes a gate connected to a reference voltage VREF.

A P-channel current mirror 210 is also included. A first transistor 212 and a second transistor 214 of P-channel current mirror 210 include gates, which are connected at node 216. The gates of transistors 212 and 214 are also connected to node 218. A node 220 is connected to transistors 212 and 206. Node 220 is an output node of first stage 202 (output of the differential amplifier) and connects to a second stage 223. A current source 209 may include a transistor. Current source 209 is controlled by a voltage VIREF.

Figure 2C:
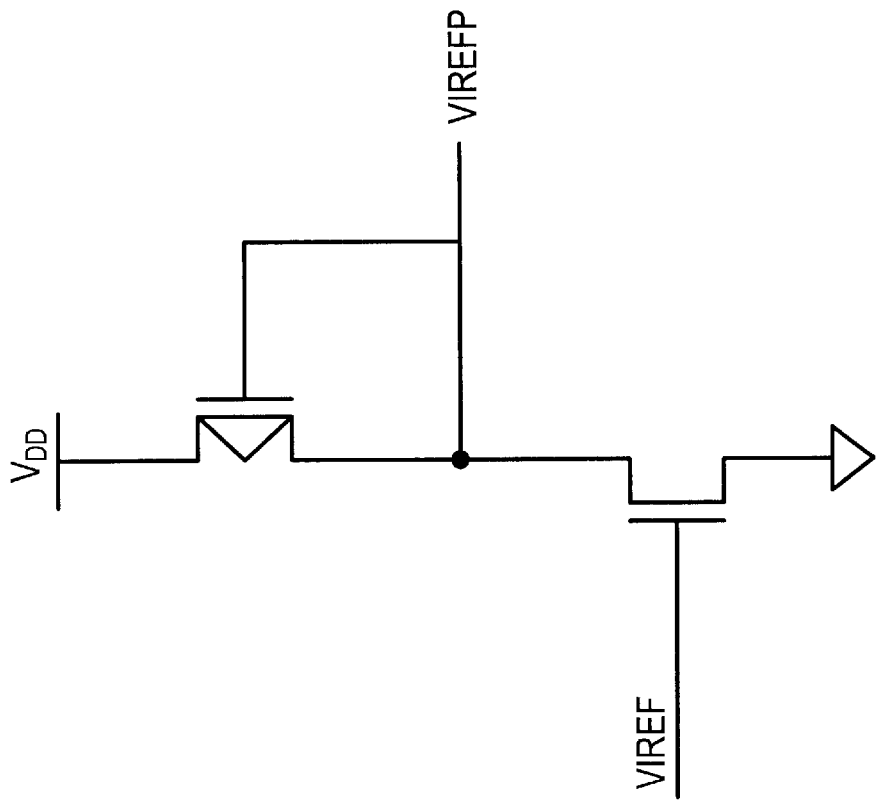
FIG. 2C is a schematic diagram illustratively showing a circuit for generating a reference voltage for the present invention.
Figure 2B:
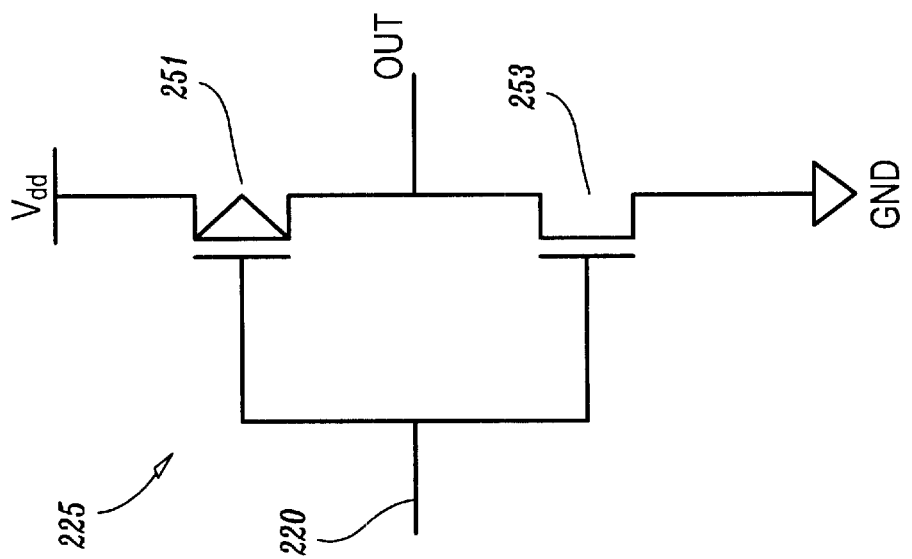
FIG. 2B is a schematic diagram illustratively showing the inverter of the circuit of FIG. 2A for the present invention.

A switching circuit 207 is coupled to the output node of the first stage for driving signals through circuit 200 in accordance with a control signal. Second stage 223 of circuit 200 includes a logic gate 224, such as an inverter, an AND gate, an OR gate or other logic gate. For this illustrative example, gate 224 includes an inverter 225. Inverter 225 includes a PFET 251 and an NFET 253 as shown in FIG. 2B. Second stage 223 provides a switching capability for skewing the driving power to favor one of rising or falling edges. In this way, the skewing provides noise suppression during a delay period after a valid transition (from rising to falling or vice versa). Circuit 200 provides hysteresis to the output (OUT).

Figure 5:
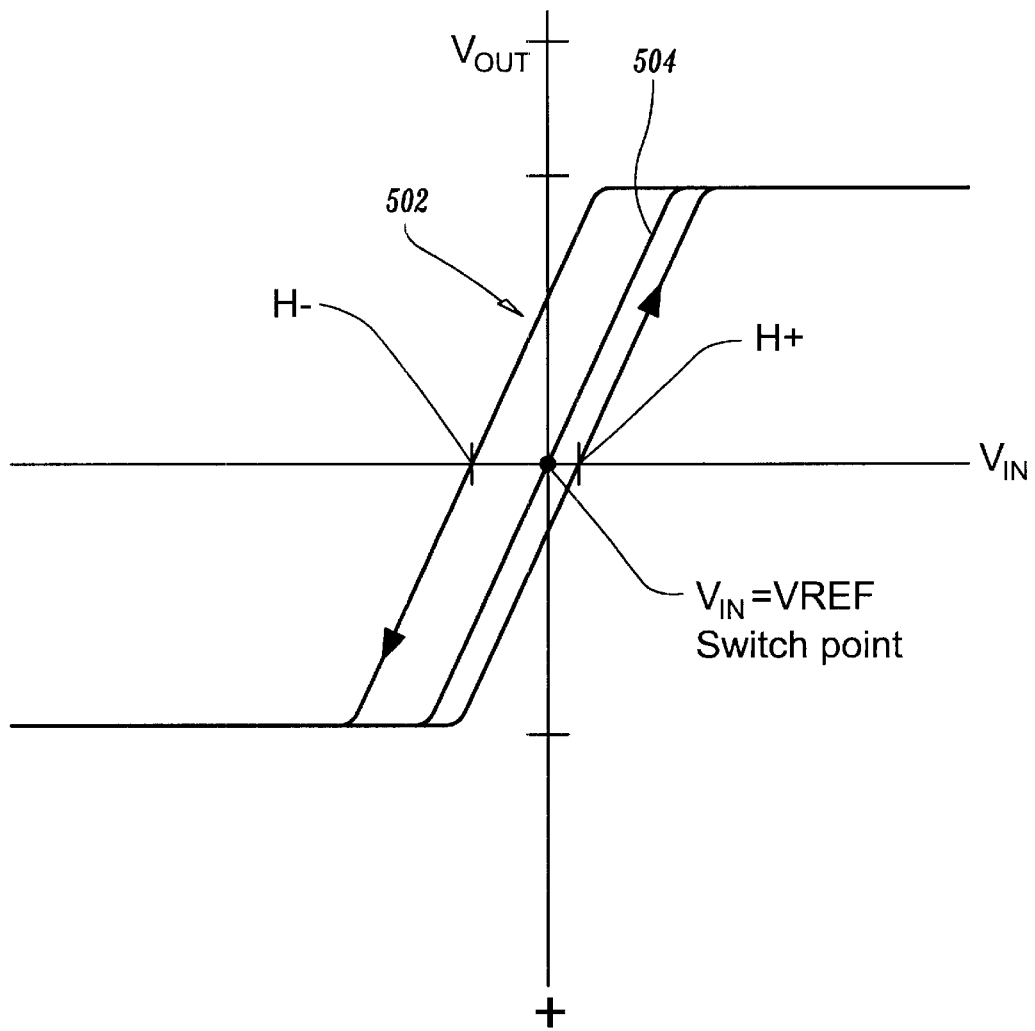
FIG. 5 is a plot showing hysteresis for switch point adjustment in accordance with the present invention.

The overall transfer characteristics of circuit 200 includes hysteresis as indicated e.g., in FIG. 5. In the circuit 200, reverse hysteresis may be introduced by heavy skew of a transistor 226 relative to the NFET 253 of inverter 225 (FIG. 2B). Skewing as described herein is provided by adjusting the delays/strengths of the respective transistors. This adjustment may be provided by transistor strength adjustment, which is related to the size of the transistor.

The heavy skew between transistor 226 relative to the NFET 253 on inverter 225 is provided for a transition of VIN from LOW to HIGH (rising). During this transition a first transfer gate S1 is conducting to provide current to the output OUT through inverter 225. Similarly, for a transition of VIN from HIGH to LOW (falling), a transfer gate switch S2 is conducting and the heavy skew is reversed.

In one example, skew is provided by the strength of transistors 251, 253, 226 and 228. For a LOW to HIGH transition at VIN, stage 223 favors a rising edge by making switch S1 and switch 242 conduct. When switches S1 and 242 conduct the output at node 220 is skewed since inverter NFET 253 has a strength ratio with PFET 226 of between about 1:3 to about 1:10. This skew helps to suppress any noise after the transition.

In the example, for a HIGH to LOW transition of VIN, stage 223 favors a falling edge by making switch S2 and switch 240 conduct. When switches S2 and 240 conduct the output at node 220 is skewed since inverter PFET 251 (FIG. 2B) has a strength ratio with NFET 228 of between about 1:3 to about 1:10. Again, this skew helps to suppress any noise after the transition.

Transistor 226 is driven by node 220 through gate S1, if conducting. If S1 is not conducting, then switch 240 (transistor 234) is on to pull node 244 to Vdd and switch off transistor 226. Transistor 228 is driven by node 220 through gate S2, if conducting. If S2 is not conducting, then switch 242 is on to pull node 246 to ground and switch off transistor 228.

Transistor 228 is skewed versus the PFET 251 of inverter 225, transistor 226 is skewed versus the NFET 253 of inverter 225. As a result of heavy skew provided above noise suppression for dynamic switching is realized and reverse hysteresis of circuit 200 may occur. In accordance with the present invention, this reduced or reversed hysteresis may be compensated for by providing current adjustment at nodes 244 and 246. The current adjustment may be realized by including current sources 231 and 233.

In a preferred embodiment, current sources 231 and 233 supply current proportional to the current of current source 209. This may be achieved by employing the same gate voltage VIREF (or VIREFP for P-channel transistors, as provided by the illustrative circuit of FIG. 2C). Since the skewing of second stage 223 may affect hysteresis, hysteresis of circuit 200 is compensated for or adjusted to achieve the desired amount of hysteresis (e.g., about 10 to 50 mV) for circuit 200.

Transfer gates S1 and S2 are illustratively shown as CMOS gates, other arrangements and configurations are also contemplated. Gates S1 and S2 (and switches 240 and 242) are activated/deactivated in accordance with feedback from OUT. An inverter 229 is employed to reverse the polarity of the signal across gates S1 and S2.

In one embodiment, current sources 231 and 233 include transistors. A transistor 230 is employed as a current source with a connection to supply voltage Vdd, while a transistor 232 is employed as a current source with a connection to ground GND. Other current source configurations may also be employed.

Response time of circuit 200 is dependent on the current state through switches S1 and S2. However, the static switching levels only slightly depend on the setting of the two switches S1 and S2. This slight difference of the switching points for the falling and rising transitions can be compensated by current sources 231 and 233 (shown as, transistors 230 and 232, respectively). These current sources 231 and 232 supply a small percentage (for example, about 5–10%) of the differential amplifier supply current (e.g., current through current source 209. Current sources 231 and 233 may be sized to adjust the amount of hysteresis for a given application (See FIG. 5).

As the gate voltages of transistors 230 and 232 are derived from the gate voltage of the current source 209 of the differential amplifier of first stage 202 the percentage ratio of supply current is well controlled to nodes 244 and 246.

Advantageously, due to nodes 244 and 246 having a high impedance, a small current has a significant effect on the switching levels while not dramatically adding to the delay. Circuit 200 of the present invention permits transition switching which is immune from noise of the input signal since the skewing of stage 223 favors only rising or falling edges at a given time. The reverse hysteresis due to the skewing, for example, transistor strength skewing of stage 223 is compensated for by employing current sources 231 and 233.

Advantageously, the present invention suppresses noise spikes after transitions for a predetermined amount of time after a transition. This predetermined amount of time may be provided by delay in a feedback loop 250. Feedback loop 250 is provided between output OUT and node 248 and is employed to control switches S1 and S2. Feedback loop 250 preferably includes delay elements 252 (in this case inverter pairs) to delay this feedback control signal. In the example that follows, inverter pairs are selected which provide about a 2 ns delay to the feedback control signal. This delay period (or suppression of noise period) may be modified as needed. FIG. 2A may include a delay line 333, which includes a plurality of delay elements (e.g., inverters 252). Delay line 333 may be controlled or is programmable to modify the delay thereof. A control circuit 335 includes a circuit for deriving delay. Delay may be derived as a portion (e.g., percent fraction) of clock frequency, for example. A control signal may be provided from control circuit 335. Control circuit 335 may include for example, a DLL or a PLL, or other programmable circuits for programming delay in delay line 333. In an alternate embodiment, delay may be provided by trimming delay elements to provide an appropriate delay in delay line 333.

Figure 1:
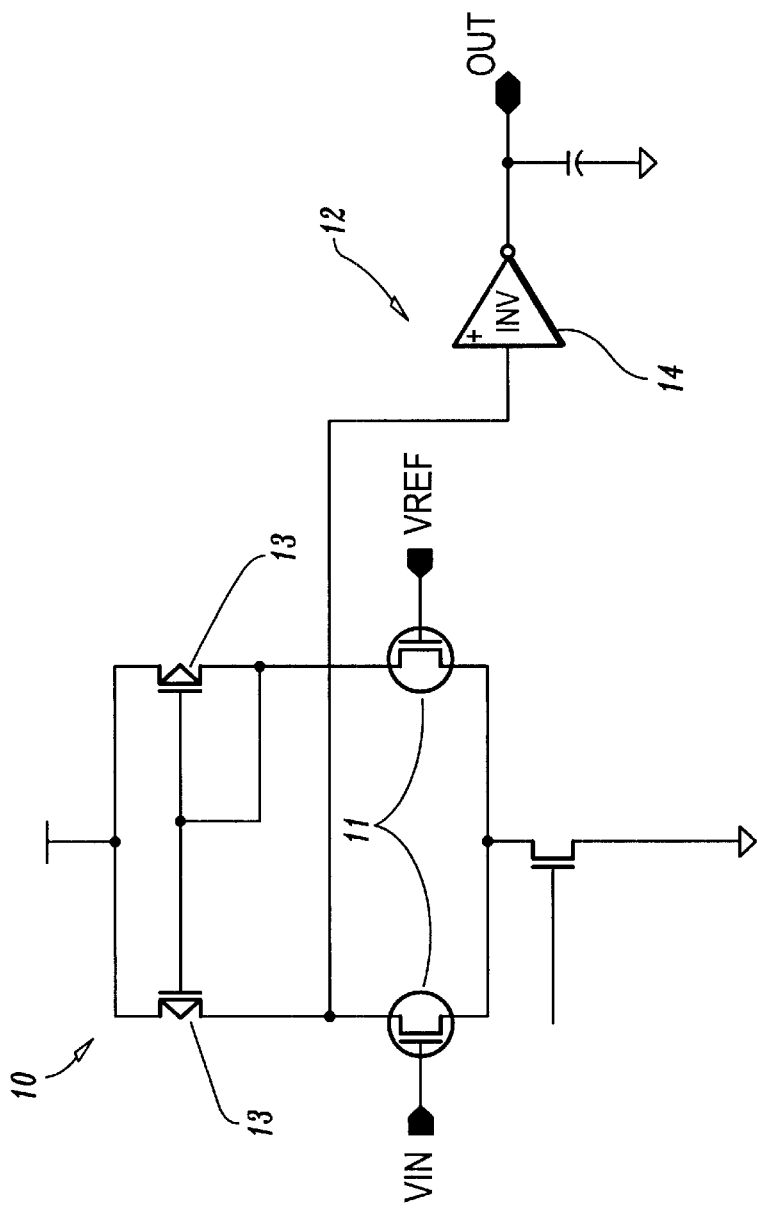
FIG. 1 is a schematic diagram showing a prior art receiver circuit with insufficient hysteresis control.
Figure 3:
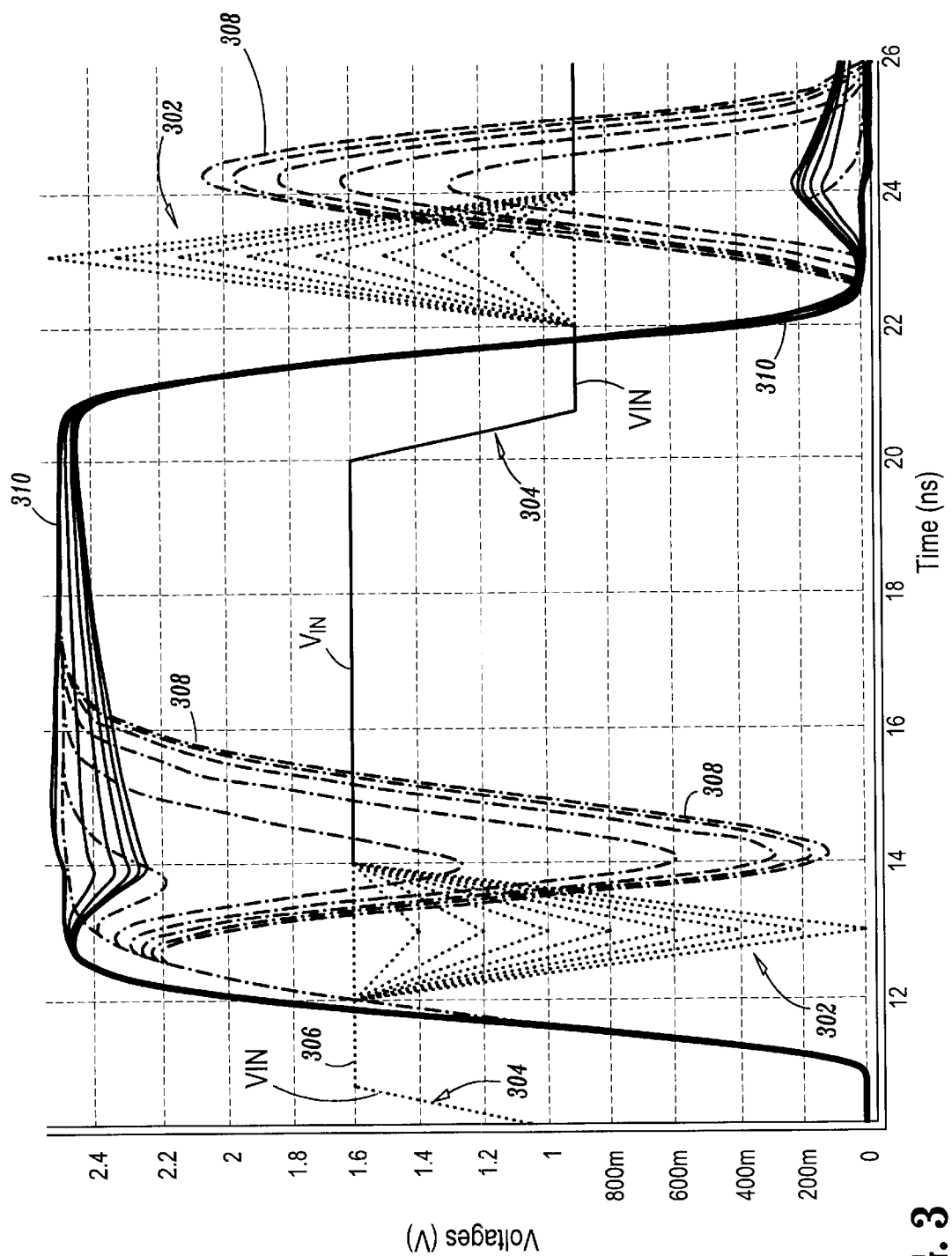
FIG. 3 is a plot comparing the response after transitions of the conventional circuit of FIG. 1 with the response of circuit of FIG. 2A in accordance with the present invention.

Referring to FIG. 3, responses of the conventional circuit of FIG. 1 and receiver circuit 200 are compared. In case of no noise, both realizations show virtually identical delay of about 1.4 ns. Note that both receivers consume the same amount of current (~100 μA). FIG. 3 also shows the responses of the two receivers in case of input noise 302 asserted shortly (1 ns) after a transition 304. Line 306 represents the input signal VIN with 8 levels of noise 302 superimposed. Dashed lines 308 show the output of the conventional receiver (FIG. 1) for the 8 levels of noise of the input. Solid lines 310 show the response of the noise immune receiver of the present invention (FIG. 2A) for the 8 levels of noise. In all cases the width of the noise pulses was 2 ns (302). The reduction of the amplitude of the noise spikes is significantly reduced in accordance with the present invention.

Figure 4:
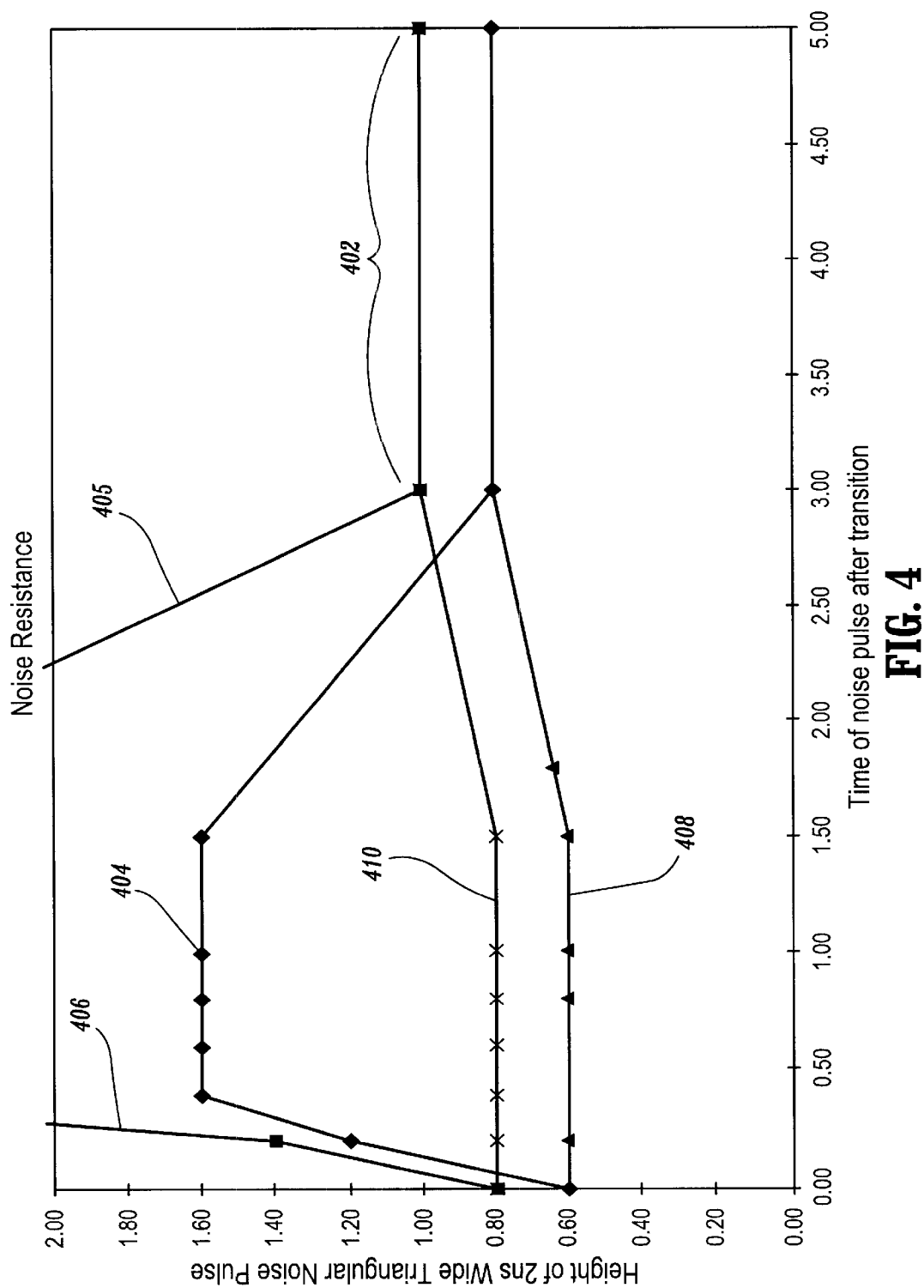
FIG. 4 is a plot comparing pass/fail criteria for noise resistance after transitions of the conventional circuit of FIG. 1 with that of circuit of FIG. 2A in accordance with the present invention.

Referring to FIG. 4, the noise responses of both receiver circuits are summarized. While for noise long after a transition the noise resistance of both receivers seems to be comparable (~0.9V in region 402), the receiver of the present invention has significantly more noise resistance for about 2ns after a transition. The receiver circuit of the present invention has a much higher resistance to noise as shown on by pass line 404 and fail line 406. Failures are in regions above the fail lines and passes are in regions below the pass lines. The pass and fail lines of FIG. 4 would converges to a single pass-fail line with a higher number of data points. Pass line 408 and fail lines 410 for the conventional circuit (FIG. 1) show much lower noise resistance. The time of improved noise resistance, after a transition, is determined by the delay in feedback loop 250 (FIG. 2A) that controls the switches S1 and S2. The delay value of the feedback loop 250 is preferably smaller than half the desired minimum clock period of the input signal.

Referring to FIG. 5, a hysteresis window 502 is shown. Hysteresis H may be adjusted about a nominal switch point (e.g., on the line 504 the switch point is where VIN=VREF). In one embodiment, H+ and H− are equal (e.g., symmetric about the switch point), however, H+ and H− may be adjusted about the nominal switch point as needed. In accordance with the invention, by developing a skew between transistor strength of transistors of inverter 225 (FIG. 2A) and transistors 226 and 228 and by sizing current sources 231 and 233, to adjust the amount of hysteresis for a given application, the hysteresis may be well controlled. In other words, for a hysteresis of 10 mV the switch point for a rising edge is offset by 10 mV from a falling edge. This helps distinguish rising and falling edges to prevent problems for circuits relying, for example on clock signals.

It is to be understood that the present invention may be employed in a plurality of different applications. For example, the present invention may be implemented on a semiconductor memory chip or other semiconductor device for receiving analog input signals (clock signals) and converting the input signals to digital pulses after noise suppression. Other applications may include, but are not limited to telephony or signal processing applications. By adjusting hysteresis in accordance with the present invention, time is conserved by the overall circuit, noise is efficiently suppressed and the reliability of the received signals is improved.

In one embodiment, p-channel transistors may be desirable at appropriate locations in the circuits to provide SSTL (stub series terminated logic) logic, low voltage CMOS or other logic. In other embodiments, n-channel transistors are desirable. It is to be understood that the circuits of the present invention may have p-channel and n-channel devices interchanged as would be understood to one skilled in the art. Having described preferred embodiments for receiver immune from slope-reversal noise (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A receiver circuit comprising:
    a first stage having an input for receiving input signals and an output node, the first stage including an amplifier;
    a second stage having an input coupled to the output of the first stage, the second stage further comprising:
        a switching circuit coupled to the output node of the first stage for driving the input signals by favoring one of a rising edge or a falling edge in accordance with a control signal; and
        a feedback loop coupled to an output of the second stage, the feedback loop providing the control signal for switching the switching circuit to favor the rising edge or falling edge.

2. The receiver circuit as recited in claim 1, wherein the second stage includes an inverter coupled to the output of the first stage, the inverter having an output representing the output of the receiver circuit.

3. The receiver circuit as recited in claim 2, wherein the second stage includes:
    a first transistor coupled between the output of the inverter and a supply voltage; and
    second transistor coupled between the output of the inverter and a ground, wherein the first and second transistors have different strengths relative to transistors of the inverter to provide skewed driver strength for driving the input signals to the output of the second stage.

4. The receiver circuit as recited in claim 3, wherein the second stage includes:
    current sources being coupled to an input of the inverter and coupled to gates of the first and second transistors through the switching circuit to provide driving current to the inverter and the first and second transistors in accordance with the control signal.

5. The receiver circuit as recited in claim 1, wherein the switching circuit includes switching elements switched by the control signal to alternately select circuit elements which favor a rising edge and a falling edge.

6. The receiver circuit as recited in claim 5, wherein the switching elements include CMOS transfer gates.

7. The receiver circuit as recited in claim 1, wherein the amplifier includes a differential amplifier.

8. The receiver circuit as recited in claim 1, wherein the amplifier includes a transconductance amplifier.

9. The receiver circuit as recited in claim 1, wherein the input signals include analog signals and the receiver circuit suppresses noise of the analog signals.

10. The receiver circuit as recited in claim 1, wherein the output represents a digital logic state.

11. The receiver circuit as recited in claim 1, wherein the feedback loop includes delay elements such that noise after a transition in the input signals is suppressed for a delay period provided by the delay elements provided by the delay elements.

12. The receiver circuit as recited in claim 11, wherein the feedback loop is programmable to adjust the delay period provided by the delay elements.

13. The receiver circuit as recited in claim 11, wherein the feedback loop is controlled by a control circuit to adjust the delay period provided by the delay elements.

14. The receiver circuit as recited in claim 11, wherein the delay period is controlled in accordance with an input signal input to the receiver circuit.

15. The receiver circuit as recited in claim 11, wherein a delay value of the delay elements is less than half a clock period of the input signal.

16. A receiver circuit comprising:
   a first stage having an input for receiving input signals and an output node, the first stage including an amplifier;
   a second stage having an input coupled to the output of the first stage, the second stage further comprising:
      an inverter coupled to the output of the first stage, the inverter having an output representing the output of the receiver circuit and including transistors;
      a first transistor coupled between the output of the inverter and a supply voltage;
      a second transistor coupled between the output of the inverter and a ground, wherein the first and second transistors have different strengths relative to the transistors of the inverter to favor a transition edge being driven to suppress noise after the transition edge; and
      a feedback loop coupled from the output of the inverter for enabling switching elements, the switching elements being switched in accordance with the output of the inverter to favor the transition edge being driven at the output of the inverter.

17. The receiver circuit as recited in claim 16, wherein the first transistor includes a P-channel transistor and the inverter includes an N-channel transistor and a relative strength ratio between the P-channel transistor and the N-channel transistor is between about 3:1 to about 10:1.

18. The receiver circuit as recited in claim 16, wherein the second transistor includes an N-channel transistor and the inverter includes an P-channel transistor and a relative strength ratio between the N-channel transistor and the P-channel transistor is between about 3:1 to about 10:1.

19. The receiver circuit as recited in claim 16, further comprising current sources coupled to an input of the inverter and coupled to gates of the first and second transistors through the switching elements to provide driving current to the inverter and the first and second transistors in accordance with a control signal on the feedback loop.

20. The receiver circuit as recited in claim 16, wherein the switching elements include CMOS transfer gates.

21. The receiver circuit as recited in claim 16, wherein the amplifier includes a differential amplifier.

22. The receiver circuit as recited in claim 16, wherein the amplifier includes a transconductance amplifier.

23. The receiver circuit as recited in claim 16, wherein the input signals include analog signals and the receiver circuit suppresses noise of the analog signals.

24. The receiver circuit as recited in claim 16, wherein the inverter output represents a digital logic state.

25. The receiver circuit as recited in claim 16, wherein the feedback loop includes delay elements such that noise after a transition in the input signals is suppressed for a delay period provided by the delay elements provided by the delay elements.

26. The receiver circuit as recited in claim 25, wherein the feedback loop is programmable to adjust the delay period provided by the delay elements.

27. The receiver circuit as recited in claim 25, wherein the feedback loop is controlled by a control circuit to adjust the delay period provided by the delay elements.

28. The receiver circuit as recited in claim 25, wherein the delay period is controlled in accordance with an input signal input to the receiver circuit.

29. The receiver circuit as recited in claim 25, wherein a delay value of the delay elements is less than half a clock period of the input signal.

30. A receiver circuit, comprising:
   a first circuit having two modes of operation controlled by a feedback loop, the feedback loop being connected to an output of the first circuit, the modes of operation including
      a first mode having a quicker response to an input falling signal edge than a second mode, and
      a second mode with a quicker response to an input rising signal edge than the first mode, wherein the first circuit includes a switching circuit having switching elements switched by the control signal to alternately select circuit elements which favor a rising edge and a falling edge, wherein the feedback loop includes delay elements such that noise after a transition in the input signals is suppressed for a delay period provided by the delay elements, and wherein the feedback loop is programmable to adjust the delay period provided by the delay elements.

31. A receiver circuit comprising:
   a first circuit having two modes of operation controlled by a feedback loop, the feedback loop being connected to an output of the first circuit, the modes of operation including
      a first mode having a quicker response to an input falling signal edge than a second mode, and
      a second mode with a quicker response to an input rising signal edge than the first mode, wherein the first circuit includes a switching circuit having switching elements switched by the control signal to alternately select circuit elements which favor a rising edge and a falling edge, wherein the feedback loop includes delay elements such that noise after a transition in the input signals is suppressed for a delay period provided by the delay elements, and wherein the feedback loop is programmable to adjust the delay period provided by the delay elements and wherein the feedback loop is controlled by a control circuit to adjust the delay period provided by the delay elements.

* * * * *